United States Patent
Bingle

(10) Patent No.: US 9,745,778 B1
(45) Date of Patent: Aug. 29, 2017

(54) KEYLESS ENTRY HANDLE AND COMPRESSIBLE SPACER THEREFOR

(71) Applicant: Robert Bingle, Walker, MI (US)

(72) Inventor: Robert Bingle, Walker, MI (US)

(73) Assignee: ADAC PLASTICS, INC., Grand Rapids, MI (US)

( * ) Notice: Subject to any disclaimer, the term of this patent is extended or adjusted under 35 U.S.C. 154(b) by 537 days.

(21) Appl. No.: 14/215,318

(22) Filed: Mar. 17, 2014

Related U.S. Application Data

(60) Provisional application No. 61/787,136, filed on Mar. 15, 2013.

(51) Int. Cl.
*E05B 3/00* (2006.01)
*E05B 49/00* (2006.01)
*E05B 81/78* (2014.01)

(52) U.S. Cl.
CPC ............ *E05B 49/004* (2013.01); *E05B 81/77* (2013.01); *E05B 81/78* (2013.01)

(58) Field of Classification Search
CPC ............. Y10T 292/0822; Y10T 292/57; E05B 49/004; E05B 81/76; E05B 81/77; E05B 81/78; Y10S 292/65
See application file for complete search history.

(56) References Cited

U.S. PATENT DOCUMENTS

| | | | | |
|---|---|---|---|---|
| 2003/0029210 A1* | 2/2003 | Budzynski | ............. | E05B 85/10 70/278.1 |
| 2006/0071755 A1* | 4/2006 | Muller | .................... | E05B 81/78 340/5.72 |
| 2007/0008235 A1* | 1/2007 | Tsukahara | ............... | E05B 81/78 343/788 |
| 2007/0115191 A1* | 5/2007 | Hashiguchi | ............. | E05B 81/78 343/713 |

(Continued)

FOREIGN PATENT DOCUMENTS

DE    102004042112 A1 *  3/2005  ............. E05B 81/78

*Primary Examiner* — Alyson M Merlino
(74) *Attorney, Agent, or Firm* — Dickinson Wright PLLC

(57) ABSTRACT

A spacer for a keyless-entry vehicle door handle of the type including mateable body and cover portions, and at least one electronic component disposed in an internal space of the handle defined by the body and cover portions, the at least one electronic component having first and second portions each arranged in proximity to one or the other of opposing interior surfaces of the body and cover portions of the handle. The spacer includes a compressible member disposed in the internal space of the handle, the compressible member having a body with opposite surfaces each facing one of the opposing interior surfaces of the body and cover portions of the handle, and recesses formed in each of the opposite surfaces, each recess dimensioned to receive therein one or the other of the first and second portions of the at least one electronic component. The compressible member is dimensioned so as to be compressed between the (Continued)

opposing interior surfaces of the body and cover portions of the handle so that, when the compressible member is compressed, each of the first and second portions of the at least one electronic component are urged into intimate contact with one or the other of the opposing interior surfaces of the body and cover portions of the handle.

8 Claims, 7 Drawing Sheets

(56) References Cited

U.S. PATENT DOCUMENTS

| | | | |
|---|---|---|---|
| 2009/0256677 A1* | 10/2009 | Hein | B60R 25/00 |
| | | | 340/5.72 |
| 2013/0033362 A1* | 2/2013 | Hourne | E05B 81/77 |
| | | | 340/5.72 |

* cited by examiner

KEYLESS ENTRY HANDLE AND COMPRESSIBLE SPACER THEREFOR

CROSS-REFERENCE TO RELATED APPLICATIONS

The present application relates to, and claims the benefit of priority from, U.S. Provisional Application Ser. No. 61/787,136, filed 15 Mar. 2013, the disclosure of which application is incorporated herein by reference in its entirety.

FIELD OF THE INVENTION

The invention relates to vehicle-door handles and spacers used to position one or more electronic components disposed in such handles.

BACKGROUND OF THE INVENTION

It is known to mount one or more electronic components in vehicle door handle, such components including, for instance, an antenna for a remote control unit (e.g., a "key fob" remote), sensors for a touchpad for a user to enter a vehicle access code, etc. Because vehicle door handles can deform or deflect during normal use, it is also known to mount the one or more electronic components so that they are not rigidly connected to the deformable portions of the handle. Exemplary mounting means in these regards may include springs, discrete rubber mounting projections, etc.

SUMMARY OF THE INVENTION

Disclosed herein is a spacer for a keyless-entry vehicle door-handle of the type comprising mateable body and cover portions, and at least one electronic component disposed in an internal space of the handle defined by the body and cover portions, the at least one electronic component having first and second portions each arranged in proximity to one or the other of opposing interior surfaces of the body and cover portions of the handle. The spacer comprises a compressible member disposed in the internal space of the handle, the compressible member having a body with opposite surfaces each facing one of the opposing interior surfaces of the body and cover portions of the handle, and recesses formed in each of the opposite surfaces. Each recess is dimensioned to receive therein one or the other of the first and second portions of the at least one electronic component. The compressible member is dimensioned so as to be compressed between the opposing interior surfaces of the body and cover portions of the handle so that, when the compressible member is compressed, each of the first and second portions of the at least one electronic component is urged into intimate contact with one or the other of the opposing interior surfaces of the body and cover portions of the handle.

The compressible member may be made of foam and may, additionally or in the alternative, be monolithic.

The at least one electronic component may, for example and without limitation, be a flexible PCB.

Where the vehicle door handle is of the type where the body portion includes a channel defining a principal part of the internal space of the handle, and with the channel being recessed relative to lateral shoulders of the body portion, the spacer further comprises laterally extending parts projecting oppositely from the body proximate the surface of the body facing the interior surface of the handle cover portion. The laterally extending parts are dimensioned to be compressed between the interior surface of the handle cover portion and the lateral shoulders of the body portion. Further, the recess formed in the surface of the body facing the interior surface of the handle cover portion is partially formed in the laterally extending parts.

BRIEF DESCRIPTION OF THE DRAWINGS

The foregoing, and other features and attributes of the present invention will be better understood on reference to the written specification and drawings, of which:

FIG. 3a is perspective view showing the front surface of a sensor employed in the keyless-entry system according to the exemplary embodiment;

FIG. 3b is a perspective view showing the rear surface of the sensor of FIG. 3a;

WRITTEN DESCRIPTION

Figure 1:
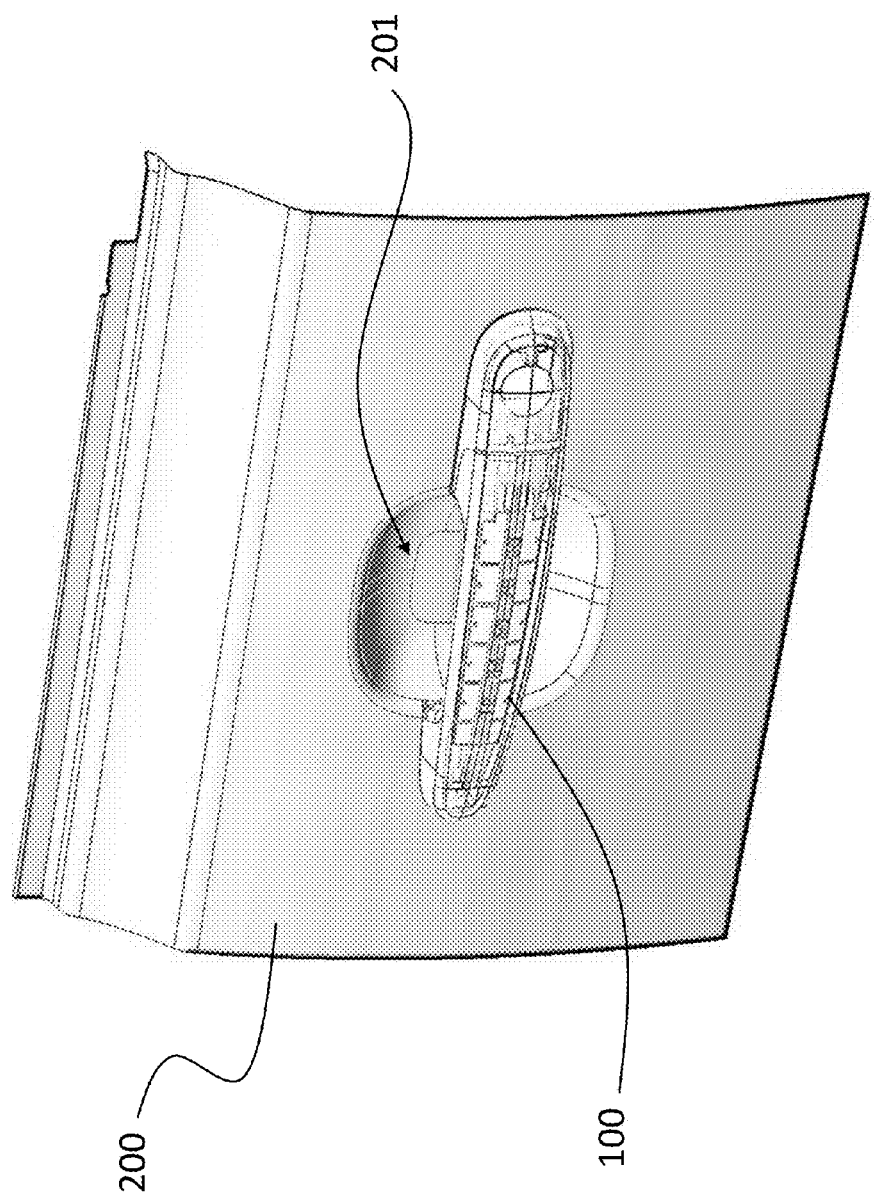
FIG. 1 a detailed, perspective view of a vehicle door handle comprising a keyless-entry system, the vehicle door handle shown in an operational environment mounted to the exterior of a vehicle door.
Figure 2:
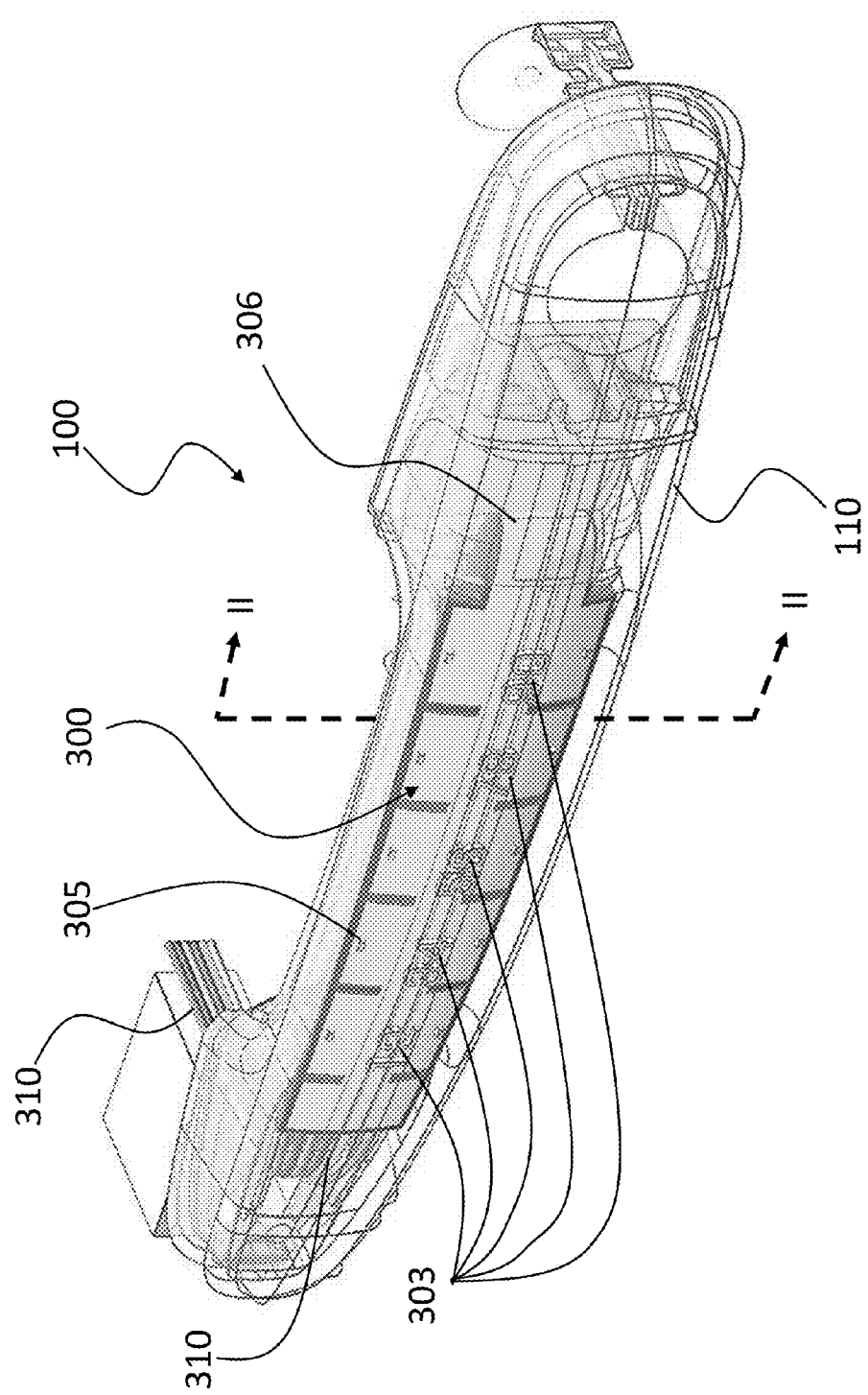
FIG. 2 is a perspective view of the vehicle door handle of FIG. 1, shown detached from the vehicle door.
Figures 3A, 3B:
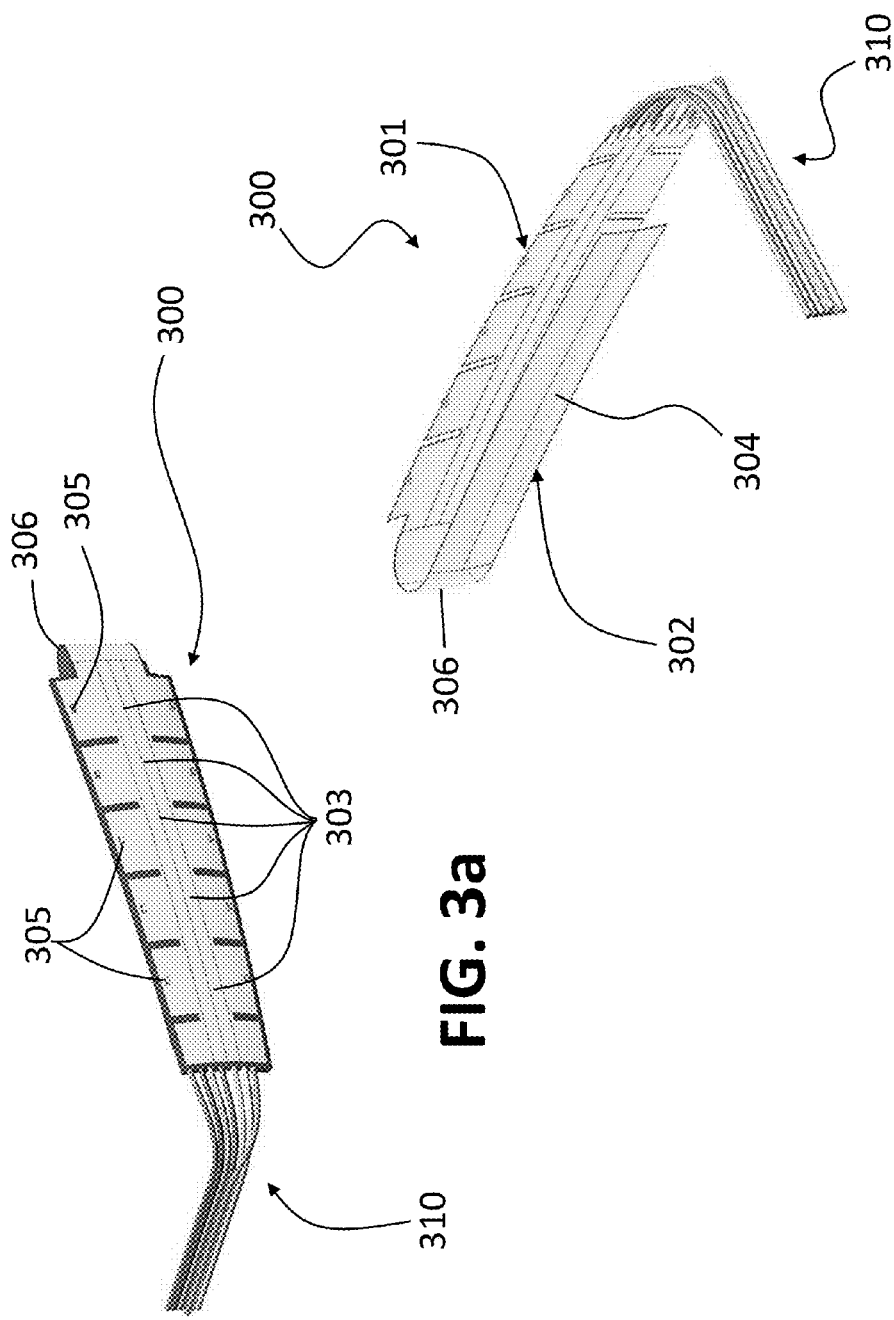

As required, a detailed embodiment of the present invention is disclosed herein. However, it is to be understood that the disclosed embodiment is merely exemplary of the invention that may be embodied in various and alternative forms. The drawings are not necessarily to scale, and some features may be exaggerated or minimized to show details of particular components. Therefore, specific structural and functional details disclosed herein are not to be interpreted as limiting, but merely as a representative basis for teaching one skilled in the art to variously make and employ the present invention.

Referring to the drawings, wherein like numerals indicate like or corresponding parts throughout the several views, the present invention may be seen to generally comprise a spacer 10 for a keyless-entry vehicle door-handle 100 of the type comprising mateable body 110 and cover 101 portions, and at least one electronic component 300 disposed in an internal space 115 of the handle defined by the body 110 and cover 101 portions. The at least one electronic component 300 has first 301 and second 302 portions each arranged in proximity to one or the other of opposing interior surfaces 111, 102 of the body 110 and cover 101 portions, respectively, of the handle. The spacer 10 comprises a compressible member disposed in the internal space 115 of the handle, the compressible member having a body 11 with opposite surfaces 12, 13 each facing one of the opposing interior surfaces 111, 102, respectively, of the body 110 and cover 101 portions of the handle, and recesses 14, 15 formed in each of the opposite surfaces 12, 13, respectively, each recess 15, 14 dimensioned to receive therein one or the other of the first 301 and second 302 portions of the at least one electronic component. The compressible spacer is dimensioned so as to be compressed between the opposing interior surfaces 111, 102 of the body 110 and cover 101 portions of the handle so that, when the spacer is compressed, each of the first 301 and second 302 portions of the at least one electronic component is urged into intimate contact with one or the other of the opposing interior surfaces 102, 111, respectively, of the cover 101 and body 110 portions of the handle.

With continuing reference to FIGS. 1 through 7, handle 100 is mounted to a vehicle door 200 and operatively connected, via a linkage mechanism (not shown) disposed inside the door 200, to a latch mechanism (not shown) for securely latching the vehicle door in a closed condition (FIG. 1). Per convention, user actuation of the handle 100 effects actuation of the latch mechanism to unlatch the mechanism and permit the vehicle door to be opened.

With reference specifically to FIG. 1, in the exemplary embodiment the handle 100 is shown as a strap-style handle which, according to convention, is typically positioned on the vehicle door 200 spanning a recess or indentation 201 in the door panel's exterior surface to provide a cup for accommodating a user's fingers as he or she grasps the handle 100. Of course, it will be appreciated from the instant disclosure that the present invention may be modified to the form of any conventional vehicle handle.

In addition to the elements noted above, conventional keyless entry systems incorporate electronic and electromechanical components to effect a variety of actions in response to one or more sensed signals. These actions may include, without limitation, locking or unlocking the vehicle's doors, turning on one or more interior and/or exterior lights, starting the vehicle's engine, raising or lowering one or more of the vehicle's windows, automatically raising or lowering a tailgate door, etc. In most vehicle keyless-entry systems, a remote access device—commonly referred to as a "fob" or "key fob"—is provided which is characterized generally by the capacity to identify to the vehicle's electronic systems an authorized operator of the vehicle (at least by virtue of that operator's possession of the remote access device). The remote access device has a transmitter operative to transmit radio frequency ("RF") signals to an authenticating receiver unit installed in the vehicle. Typically, such remote access devices and authenticating receivers work in combination in one of two ways.

The first is by active, user-instigated transmission of a radio signal carrying a unique authentication code to a receiver antenna mounted in the vehicle. The receiver is operatively connected to a controller (such as the vehicle's body control module, or BCM) which is, in turn, operatively connected to the vehicle's power locks and, optionally, one or more of the vehicle's other systems. Upon verification of the received authentication code, whether by the receiver, BCM or intermediate controller, the BCM at least effects actuation of the vehicle's power locks to unlock or lock (depending upon the initial state) the vehicle (other actions may also be effected, depending upon the signals received from the remote access device).

The second conventional manner of operation of remote access devices is passive. In the case of these devices, one or more transmitting/receiving antennas mounted in the vehicle are programmed to periodically transmit a RF signal which effects responsive transmission (transmission that is picked up by the receiving antenna) by the remote access device of a RF signal carrying a unique authentication code. As with active systems, upon verification of the received authentication code, whether by the antenna, BCM or some other, intermediate controller, the BCM effects actuation of the vehicle's power locks to unlock or lock (depending upon the initial state) the vehicle.

In some conventional passive systems, BCM actuation of the power locks is further coupled to user contact with a sensor (e.g., a capacitive sensor) mounted on the vehicle (typically, the door handle). These passive systems act fast enough that the user experiences little or no delay.

Still other keyless entry systems may employ keypads on or in close proximity to the door handle. These types of systems, which may or may not operate in combination with a remote access device (by, for instance, combining authentication of an RF code from the remote access device with entry of a pre-designated key code), are designed to lock or unlock the vehicle's doors upon user entry of a pre-designated, numeric (usually) key code via the keypad. Conventional keypads are typically some form of touchpad comprising one or more capacitive sensors.

Whether comprising a passive or active-type keyless entry system, electronic components necessary to such systems, such as, for instance, capacitive sensors and/or transmitting and/or receiving antenna, are typically included in the door handle.

According to the exemplary embodiment, the door handle 100 specifically comprises at least one electronic component 300 in the form of a flexible printed circuit board (PCB). PCB 300 includes first 301 and second 302 sensor portions which, in the assembled handle, are arranged in proximity to opposite (i.e., facing away from and toward the vehicle door) sides of the handle 100. Proximate a first, exteriorly facing side of the handle 100, first 301 sensor portion defines a plurality of capacitive sensor regions 303 corresponding in location to the locations of discrete numbers provided on a keypad positioned on the handle so as to be visible to a user. Each of these capacitive sensor regions is operative to detect the presence of a user's finger(s) proximate the sensor region and correspondingly positioned numbers, thus identifying a user's sequential selection of the numbers on the keypad. PCB 300 is further operative to send corresponding signals to the vehicle's BCM, via wiring 310, to effect locking or unlocking of the vehicle's doors if the pre-designated key code is entered. Proximate a second side of the handle, second 302 sensor portion may define one or more capacitive sensor regions (a single region 304 is exemplified) operative to detect the presence of a user's fingers grasping the handle 100. If the vehicle is in an unlocked state, the signals conveyed by the PCB 300 upon detection of a user's fingers in the region 304 of second 302 sensor portion may, for instance, effect actuation of an electromechanical latch mechanism to permit the vehicle door to be opened.

Also per the illustrated embodiment, PCB 300 includes a plurality of LEDs 305 for backlighting the various "keys" of the key pad.

Of course, the particular functionality of the PCB 300 may be varied from the foregoing, exemplary embodiment; as those in skilled in the art will appreciate, the physical construction of the handle of present disclosure is not limited by the type of keyless entry system incorporated therein.

To accommodate PCB 300 therein, handle 100 is comprised of at least mateable body 110 and cover 101 portions, with the PCB 300 being disposed in the internal space 115 defined by the body and cover portions. Body 110 and cover 101 portions can be secured in any conventional fashion, including by one or more of adhesives and fasteners. Body 110 and cover 101 may also be fashioned from any suitable material or combination of materials, including one or more of plastics and metals.

As depicted, internal space 115 is sufficient to accommodate the entirety of PCB 300 therein. Per convention, an outlet opening is provided through the handle for communicating the wiring 310 to an electrical connector (not shown) positioned within the interior of the door.

According to the particular embodiment of handle 100 depicted, the body portion 110 includes a channel defining a principal part of the internal space 115 of the handle. Channel is recessed relative to, and defined by, lateral shoulders 112, 113 of the body portion 110. This construction is best seen in the cross-sectional view of FIG. 5.

Figure 4:
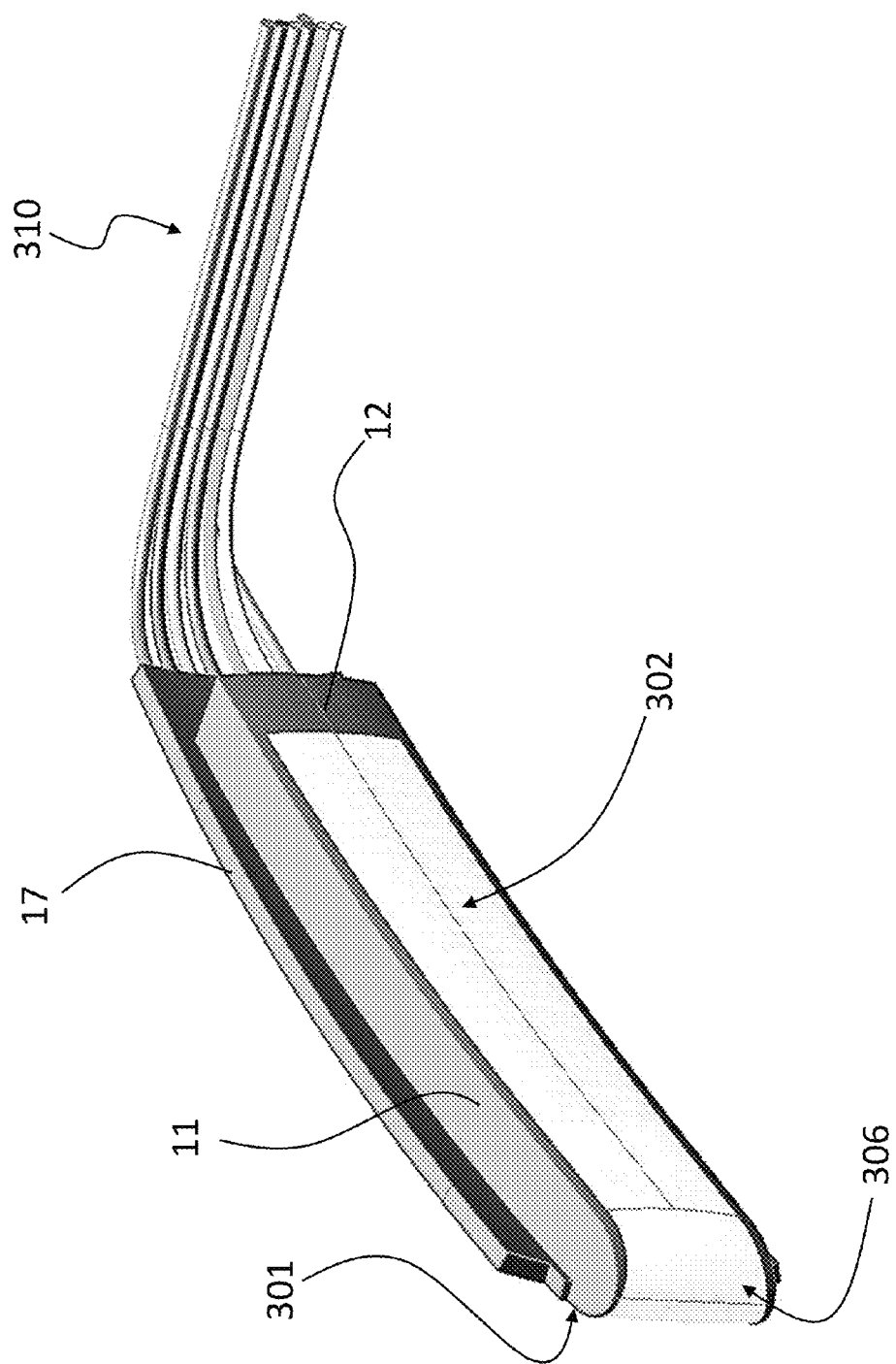
FIG. 4 is a perspective view showing the sensor of FIGS. 3a and 3b mounted upon a compressible spacer member according to an exemplary embodiment of the present invention.
Figure 5:
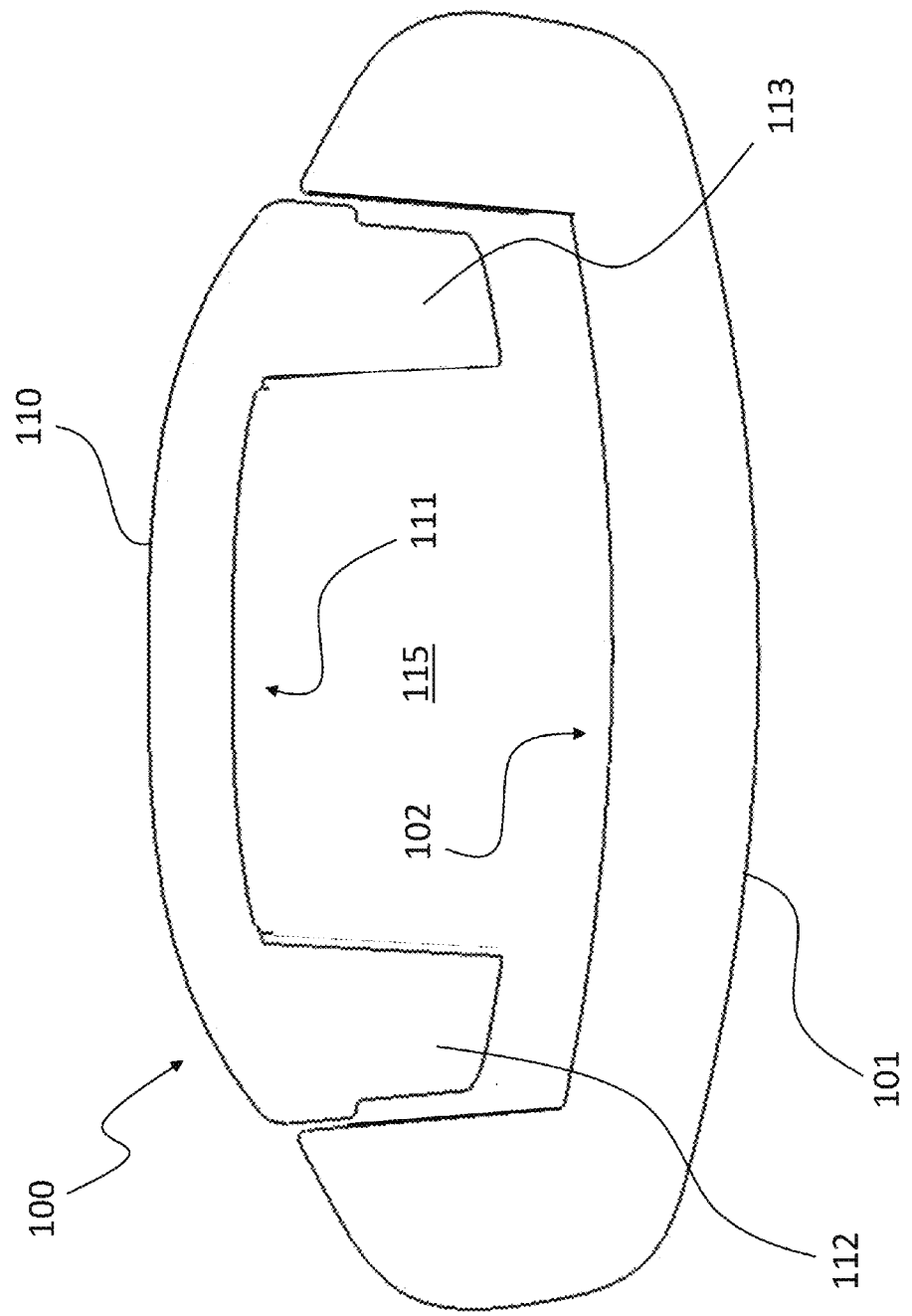
FIG. 5 is a cross-sectional view of the assembled cover and body portions of the handle.
Figure 6:
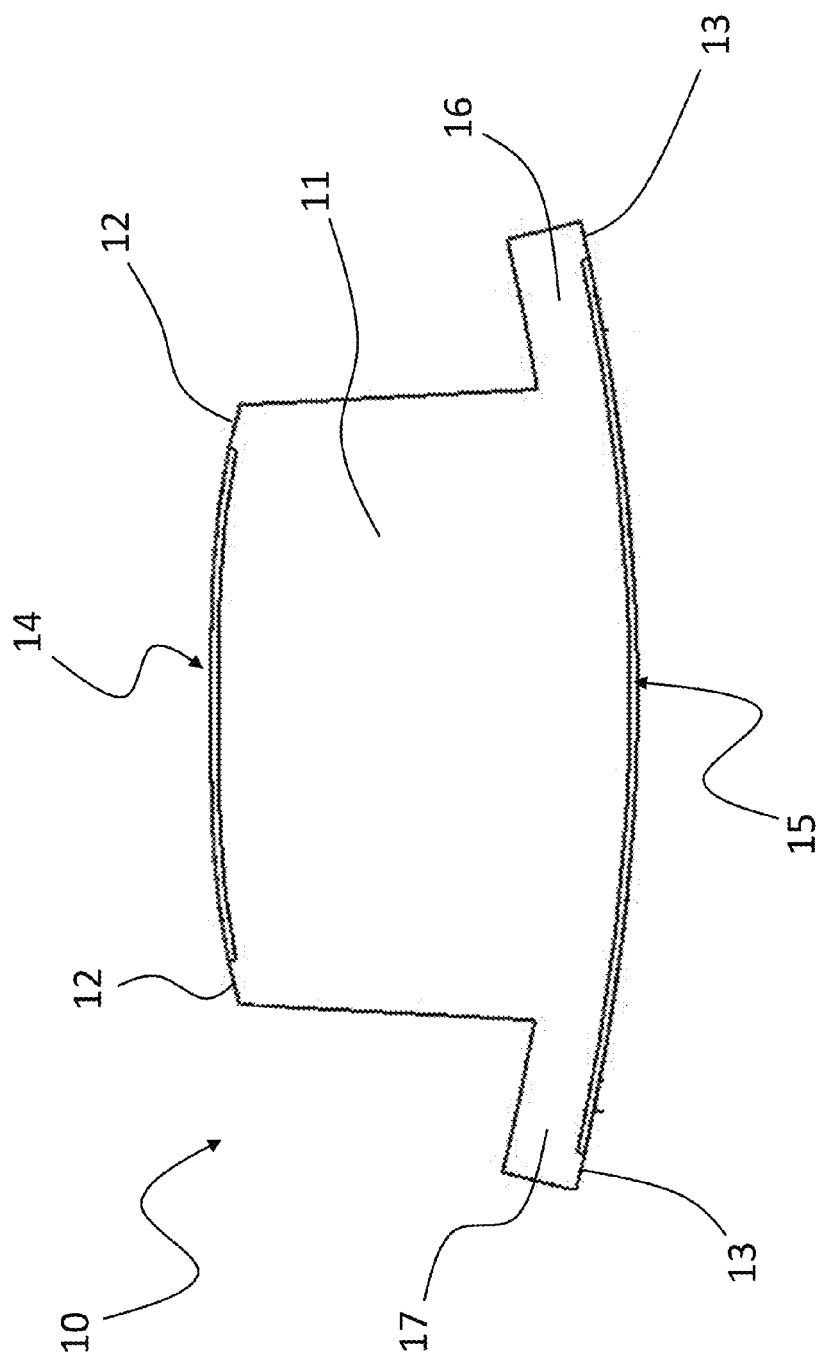
FIG. 6 is a cross-sectional view of the spacer member.
Figure 7:
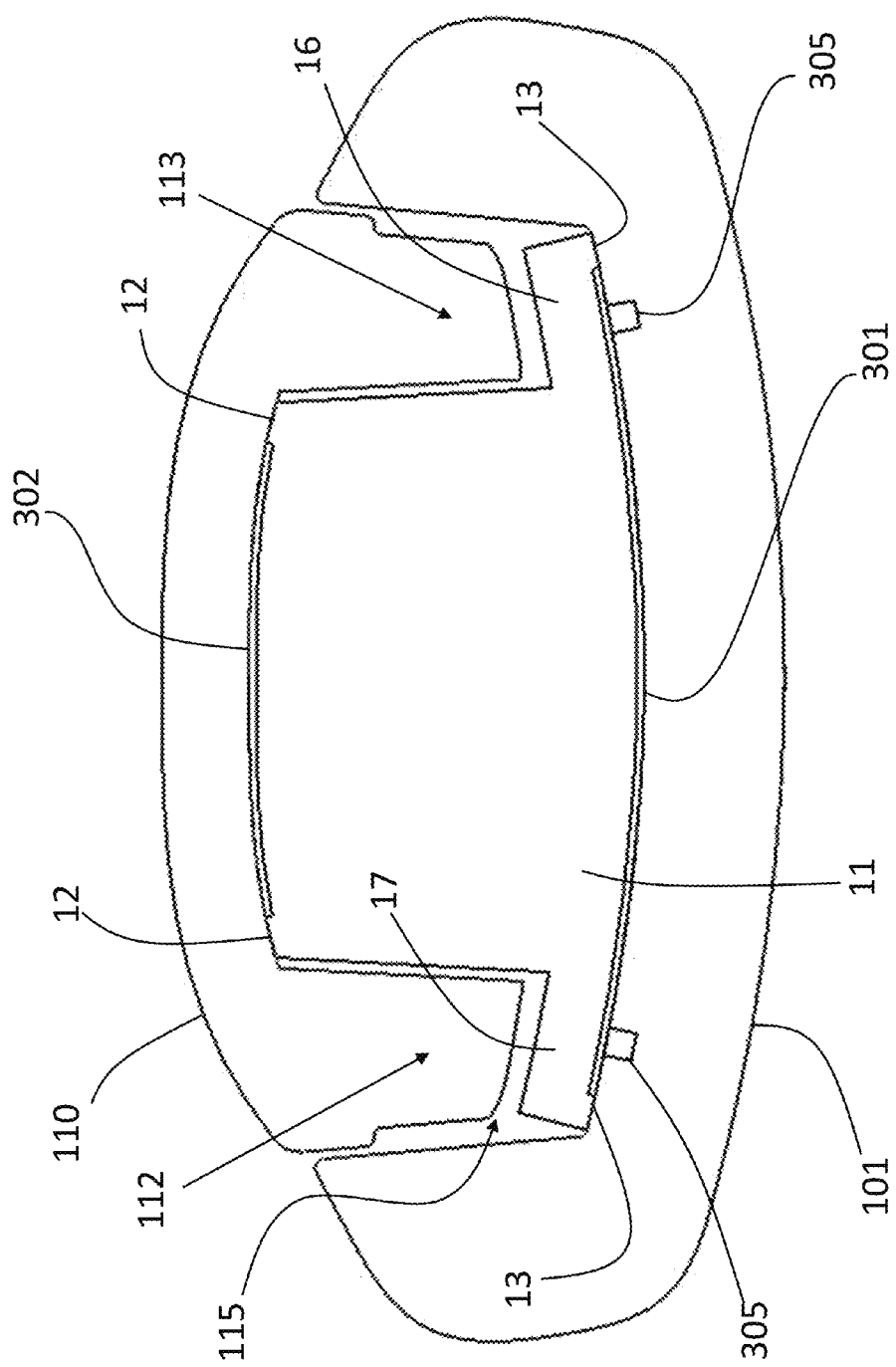
FIG. 7 is a simplified cross-sectional view, taken along lines II-II of FIG. 2, showing the arrangement of the compressible spacer member, the sensor, and the cover and body portions of the handle.

Referring particularly to FIGS. 4 and 6, spacer 10 comprises a compressible member disposed in the internal space 115 of the handle 100, the compressible member serving to maintain the first 301 and second 302 portions of the flexible PCB 300 in intimate contact with opposing interior surfaces 102, 111, respectively, of the cover 101 and body 110 portions of the handle 100. Compressible member includes a central body 11 and opposite surfaces 12, 13 each facing one of the opposing interior surfaces 111, 102 of the body 110 and cover 101 portions of the handle. Furthermore, recesses 14, 15 formed in each of the opposite surfaces 12, 13, respectively, are dimensioned to receive therein one of the second 302 and first 301 portions of the PCB 200.

Compressible member is made of a material such as, by way of non-limiting example, foam, foam rubber, rubber, etc., and is dimensioned so as to be compressed between the opposing interior surfaces 111, 102 of the body 110 and cover 102 portions of the handle 100 to thus exert pressure against the interiorly-facing surfaces of the PCB first 301 and second 302 portions to maintain those portions in intimate contact with opposing interior surfaces 102, 111 of, respectively, the cover 101 and body 110 portions of the handle. To this end, it will be appreciated that the recesses 14, 15 are dimensioned so that, when sensor portions 301, 302 are received therein, the outwardly facing surfaces of each of the first 301 and second 302 portions are substantially co-planar with the opposite surfaces 12, 13.

With reference particularly to FIG. 6, spacer 10 according to the illustrated embodiment comprises laterally extending parts 16, 17 projecting oppositely from the central body 11 proximate the surface 13 of the body 11 facing the interior surface 102 of the handle cover 101. As will be appreciated with reference also to FIGS. 5 and 7, these laterally extending parts 16, 17 are dimensioned to be compressed between the interior surface 102 of the handle cover 101 and the lateral shoulders 112, 113 of the body portion 110. Also as shown in FIG. 6, the recess 15 formed in the surface 13 of spacer 10 is partially formed in the laterally extending parts 16, 17 to accommodate the relatively greater width of the first 301 sensor portion.

As PCB 300 comprises an unitary, flexible PCB which is folded back on itself at bight portion 306 to define the opposing first 301 and second 302 portions, it should be understood that the recesses 14 and 15 may be part of an essentially continuous recess defined in the surface of spacer member. Alternatively, recesses 14 and 15 may be discrete.

According to a still further alternative construction, recesses 14 and 15 may be foregone altogether, although their employment is advantageous in helping to maintain the proper alignment of each of the first 301 and second 302 portions of PCB 300 relative to the handle 100.

Optionally, it is also contemplated that an adhesive may be employed between each of the first 301 and second 302 portions of PCB 300 and the opposing surfaces 102, 111 of the handle cover and body, such adhesive serving not only to maintain the proper alignment of each of the first 301 and second 302 portions of PCB 300 relative to the handle, but also to prevent the intrusion of moisture and/or debris between the first 301 and second 302 portions of PCB 300 and the opposing surfaces 102, 111 of the handle cover and body.

As depicted, spacer 10 is monolithic in construction. However, multi-part construction is also contemplated.

By the foregoing there is provided a keyless entry handle assembly, and sub-assembly therefor, which permits the simple and reliable positioning of system electronics within the handle. From the foregoing description, several benefits of the present invention will be manifest. First, that the compressible member serves to maintain the one or more electronic components in intimate contact with one or the other of the opposing interior surfaces of the body and cover portions of the handle. This will be appreciated by those skilled in the art to be advantageous to sensor performance. Second, that the compressible member fills one or more voids in the internal space of the handle, thus limiting the chance of water intrusion into the handle interior. Third, that the present invention permits fabrication of vehicle door handles of varying designs by providing, in one embodiment, a flexible electronics component and compressible spacer. As those skilled in the art will appreciate, vehicle handles are in general very similar, but not identical, in size and shape. Flexible electronics components and a compressible spacer permit each to be conformed to a certain extent to the interior dimensions of a given handle, this providing for utilization of the present invention, without modification, with a variety of different handles. This feature of the present invention, at least according to one form thereof, eliminates the need to develop unique electronic components for every single handle design and, therefore, economizes production.

Those skilled in the art will also appreciate from the foregoing disclosure that the present invention can be used with electronic components such as, but not limited to, pressure sensors, piezoelectric sensors, touch sensors, capacitive sensors, ultrasonic sensors, infrared sensors, or virtually any other conventional electronics that may be desired to be accommodated in a vehicle door handle. Accordingly, the present invention's utility is not limited to single-touch or simple lock/unlock type switches, but can be used in connection with gesture-type sensing systems, multi-touch type sensing systems, and multi-input type sensing systems, by way of example and not limitation.

Many modifications and variations of the present disclosure, all of which will be apparent to those skilled in the art having the benefit of this disclosure, are possible in light of the above teachings. Therefore, within the scope of the appended claims, the present disclosure may be practiced other than as specifically described.

The invention in which an exclusive property or privilege is claimed is defined as follows:

1. A keyless-entry vehicle door-handle, comprising:
   mateable body and cover portions defining an internal space of the handle, the mateable body and cover portions having opposing interior surfaces;
   at least one electronic component disposed in the internal space of the handle, the at least one electronic component having first and second portions each arranged in intimate contact with one or the other of the opposing interior surfaces of the body and cover portions of the handle; and a compressible member disposed in the internal space of the handle, the compressible member having a body with opposite surfaces each facing one of the opposing interior surfaces of the body and cover portions of the handle, and recesses formed in each of the opposite surfaces, each recess dimensioned to receive therein one or the other of the first and second portions of the at least one electronic component, wherein the compressible member is dimensioned so as to be compressed between the opposing interior surfaces of the body and cover portions of the handle so that, when the compressible member is compressed, the compressible member urges each of the first and second portions of the at least one electronic component into intimate contact with one or the other of the opposing interior surfaces of the body and cover portions of the handle.

2. The vehicle door-handle of claim 1, wherein the compressible member is made of foam.

3. The vehicle door-handle of claim 2, wherein the compressible member is monolithic.

4. The vehicle door-handle of claim 1, wherein the at least one electronic component is a flexible PCB.

5. The vehicle door-handle of claim 1, wherein the body portion of the handle includes a channel defining a principal part of the internal space of the handle, the channel being recessed relative to lateral shoulders of the body portion; and
wherein the spacer further comprises laterally extending parts projecting oppositely from the body proximate the surface of the body facing the interior surface of the handle cover portion, the laterally extending parts dimensioned to be compressed between the interior surface of the handle cover portion and the lateral shoulders of the body portion; and
wherein further the recess formed in the surface of the body facing the interior surface of the handle cover portion is partially formed in the laterally extending parts.

6. The vehicle door-handle of claim 5, wherein the compressible member is made of foam.

7. The vehicle door-handle of claim 6, wherein the compressible member is monolithic.

8. The vehicle door-handle of claim 5, wherein the at least one electronic component is a flexible PCB.

* * * * *